(12) United States Patent
Martinez Araiza et al.

(10) Patent No.: US 11,272,632 B2
(45) Date of Patent: Mar. 8, 2022

(54) TECHNIQUES FOR USE OF A MULTIPURPOSE LATCH

(71) Applicant: Intel Corporation, Santa Clara, CA (US)

(72) Inventors: Jorge U. Martinez Araiza, Beaverton, OR (US); Paul J. Gwin, Orangevale, CA (US); John K. Grooms, Webster, MA (US)

(73) Assignee: Intel Corporation, Santa Clara, CA (US)

( * ) Notice: Subject to any disclaimer, the term of this patent is extended or adjusted under 35 U.S.C. 154(b) by 36 days.

(21) Appl. No.: 16/832,399

(22) Filed: Mar. 27, 2020

(65) Prior Publication Data
US 2020/0229317 A1    Jul. 16, 2020

(51) Int. Cl.
*H05K 7/14*  (2006.01)
(52) U.S. Cl.
CPC ......... *H05K 7/1409* (2013.01); *H05K 7/1414* (2013.01)

(58) Field of Classification Search
CPC ...... H05K 7/1409; H05K 7/1414; H05K 7/14; H05K 7/1402; H05K 7/1462; H05K 1/0215; H01H 9/02
See application file for complete search history.

(56) References Cited

U.S. PATENT DOCUMENTS

| | | | | |
|---|---|---|---|---|
| 4,970,625 | A * | 11/1990 | Belanger | H05K 7/1414 174/382 |
| 6,190,204 | B1 * | 2/2001 | Huang | H05K 7/1448 439/359 |
| 9,904,336 | B1 | 2/2018 | Khan et al. | |
| 10,530,077 | B2 | 1/2020 | Khan et al. | |
| 2018/0189221 | A1 | 7/2018 | Morning-Smith et al. | |
| 2019/0286197 | A1 | 9/2019 | Khan et al. | |

* cited by examiner

*Primary Examiner* — James Wu
(74) *Attorney, Agent, or Firm* — Compass IP Law, PC (57) ABSTRACT

Examples may include techniques for use of a latch to secure a device inserted in a host computing system. The latch including a housing having holes or ports and an active contacts pad to receive external communication or control links routed through the holes or ports and to further route the communication or control links to circuitry at the device. The latch also including a securing pin attached to a lever to secure the device to the host computing system when the lever is engaged.

17 Claims, 6 Drawing Sheets

COUPLE A LATCH TO A CARD THAT INCLUDES A PCB HAVING CIRCUITRY RESIDENT ON THE PCB AND HAVING A CONNECTOR CONNECTED TO A FIRST SIDE OF THE PCB, THE CONNECTOR TO ENABLE THE CARD TO BE INSERTED IN A HOST COMPUTING SYSTEM, COUPLING TO INCLUDE CONNECTING A MOUNTING PLATE ATTACHED TO A HOUSING OF THE LATCH TO THE PCB, THE MOUNTING PLATE INCLUDING AN ACTIVE CONTACT PAD ARRANGED TO RECEIVE COMMUNICATION OR CONTROL LINKS ROUTED THROUGH A PLURALITY OF HOLES IN THE HOUSING AND ALSO ARRANGED TO FURTHER ROUTE THE COMMUNICATION OR CONTROL LINKS TO THE CIRCUITY RESIDENT ON THE PCB
*502*

---

ENGAGE A LEVER ATTACHED TO THE HOUSING TO CAUSE A SECURING PIN ATTACHED TO THE LEVER TO EXTEND OUTSIDE THE HOUSING TO PREVENT REMOVAL OF THE CARD FROM THE HOST COMPUTING SYSTEM
*504*

---

RECEIVE A CONTROL SIGNAL FROM AMONG THE CONTROL LINKS ROUTED THROUGH THE ACTIVE CONTACTS PAD, THE CONTROL SIGNAL GENERATED BY THE CIRCUITRY RESIDENT ON THE PCB TO INDICATE THAT THE CARD IS NO LONGER IN AN OPERATING STATE
*506*

---

DISENGAGE THE LEVER, RESPONSIVE TO THE CONTROL SIGNAL, TO CAUSE THE SECURING PIN TO RETRACT WITHIN THE HOUSING TO ENABLE THE CARD TO BE PHYSICALLY REMOVED FROM THE HOST COMPUTING SYSTEM
*508*

TECHNIQUES FOR USE OF A MULTIPURPOSE LATCH

TECHNICAL FIELD

Examples described herein are generally related to use of a multipurpose latch to secure a device inserted in a host computing system such as a datacenter server.

BACKGROUND

A computing infrastructure (e.g., cluster of servers or a data center) may include one or more computing systems or platforms. These computing systems or platforms may include a plurality of different types of compute, storage, memory or network switching nodes. These various types of nodes may be housed within various types of compute structures or server chassis. For example, physically located in multiple sleds, boxes, modules or boards disposed on a shelf, tray or rack of a given computing platform structure or server chassis.

In some examples, high capacity, high speed, and low power memory may be in high demand in datacenter deployments. Solid state drives (SSDs) including non-volatile types of memory are quickly becoming a leading approach to provide this type of memory and/or storage in the datacenter. One type of form factor for providing a high number of solid state drives is described in various specifications published by a working group of the Storage Networking Industry Association (SNIA) known as the Enterprise & Datacenter SSD Form Factor (EDSFF) working group. For example, the various specification related to form factors generated by the EDSFF working group include, but are not limited to, SFF-TA-1006: Enterprise and Datacenter 1U Short SSD Form Factor, Rev. 1.3a, published in July of 2019 ("SFF-TA-1006"), SFF-TA-1007: Enterprise and Datacenter 1U Long SSD Form Factor, rev. 1.1, published in March of 2019 ("SFF-TA-1007"), or SFF-TA-1008: Enterprise and Datacenter 3" Media Device Form Factor, rev. 1.0, published in March of 2019 ("SFF-TA-1008"). A particular type of form factor may be referred to as a "ruler SSD" and ruler SSD form factors are described in SFF-TA-1006 and SFF-TA-1007. In some deployments a large number of ruler SSDs may be inserted in a shelf, tray or rack of a given computing platform structure or chassis.

DETAILED DESCRIPTION

As mentioned above, a large number of ruler SSDs may be inserted in a shelf, tray or rack of a server chassis in a datacenter deployment. Examples are not limited to SSDs being in a ruler type form factor other types of nodes such as memory nodes including primarily volatile memory or compute nodes may also be in a ruler type form factor and may be inserted in a shelf, tray or rack of a server chassis. An important aspect of deploying these types of form factors are latching mechanisms to hold, for example, a ruler SSD into a locked position while inserted in a rack of a server chassis.

In a typical deployment of a ruler SSD in a datacenter, the ruler SSD needs to be removed from a rack of a server chassis or deployment system and then placed on a custom benchtop test platform to perform diagnostic or debugging of internal operations of the ruler SSD. Also, light emitting diodes (LEDs) on an outward facing portion of a ruler SSD may indicate if the ruler SSD may be removed from the rack. Removing the ruler SSD from the server chassis and debugging the ruler SSD outside of this deployment system changes at least some dynamics of an operating environment for the ruler SSD within the deployment system. The changed dynamics may provide an unreliable set of environmental variables that may not replicate problems or situations if the ruler SSD were still operating within the deployment system. For example, if a problem is caused by electrical interference inside the deployment system. This type of electrical interference may not be easy to identify in an external test environment.

Examples described in this disclosure include a multipurpose latch mechanism for ruler type form factors that in addition to securely latching ruler type form factors within a rack of a server chassis may include an external debug interface to an exterior or outward facing side of these form factors. The external debug interface included in the multipurpose latch mechanism, for example, may enable an operator or technician to interface with a ruler SSD without having to remove the ruler SSD from the rack of the server chassis. Also, the multipurpose latch mechanism may provide a route for active control and monitoring signals routed to or through a latch mechanism that may prevent sudden removal of the ruler type form factors and/or allow for actively monitoring a latch position status. Also, a multipurpose latch mechanism may include at least some supplemental power loss imminent (PLI) power capabilities for whatever device is within a ruler type form factor (e.g., an SSD or compute node).

Figure 1:
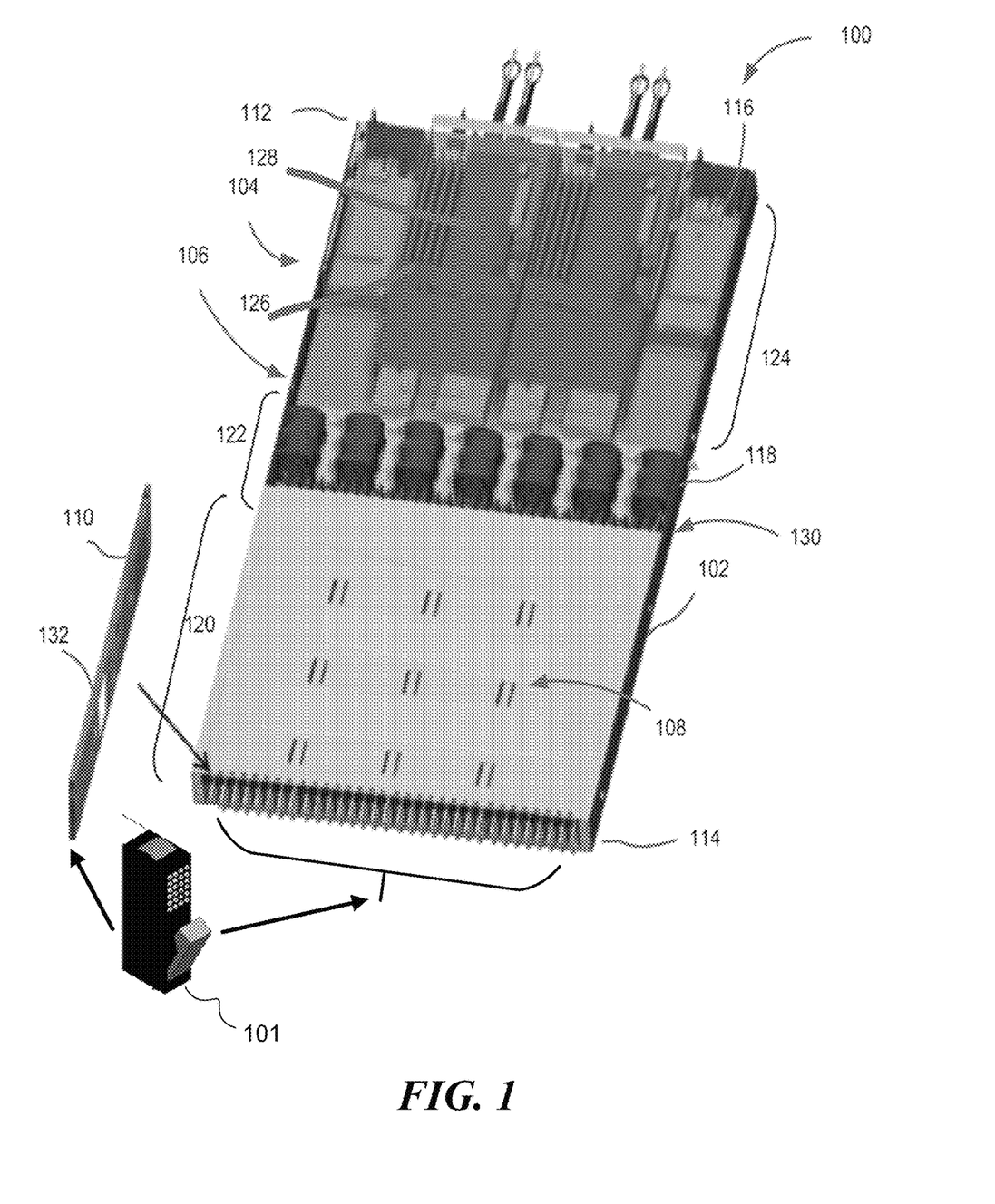
FIG. 1 illustrates an example first system.

FIG. 1 illustrates an example system 100. In some examples, system 100 may employ a multipurpose latch mechanism that is included in multipurpose latch 101. As described more, below, multipurpose latch 101 may include mechanical features to hold or secure respective cards that may be in a ruler form factor. For example, to hold card 110 while card 110 is mounted within system 100. Multipurpose latch 101 is shown in FIG. 1 in an exaggerated scale compared to card 110. In some examples, multipurpose latch 101 may have a width and height that approximately equals the width and height of card 110. For these examples, multiple multipurpose latches may be used to hold respective cards 110 while these cards are mounted within system 100. Also, in some examples, card 110 may be enclosed within a housing (not shown) and multipurpose latch 101 may have a width and height that approximately equals the width and height of the housing that encloses card 110. Comparatively, the depth of multipurpose latch 101 may be substantially less than the depth of card 110.

According to some examples, system 100 may be capable of hosting disaggregated memory, storage or compute nodes that may be in the ruler form factor as mentioned above for card 110. The disaggregated memory, storage or compute nodes may serve as disaggregated resources of a computing system. The computing system may include, but is not limited to a data center, server cluster, server farm, or the like. The ruler form factor, for example, may be similar to and/or in accordance with ruler form factors described in specifications published by the EDSFF working group such as, but not limited to, the SFF-TA-1006 or SFF-TA1007 specifications.

In some examples, system 100 may have front or top serviceability of an array of any combination of memory nodes, storage nodes or compute nodes. For example, the array may include only nodes of a same type (e.g., all storage), each node may be included on a separate card such as card 110 or the array may include a mix of memory nodes, storage nodes, and/or compute nodes, each node on a separate card. System 100 may be mounted to a sliding carrier (box) 102 to allow for other modules to be serviced without removing the chassis, such as, but not limited to, fans or interconnects. In some deployments, system 100 may be a box (e.g., enclosure) that may be insertable into or removable from a tray, sled or shelf in a computer rack.

According to some examples, system 100 may be a memory/storage system. For these examples, card 110 may include a printed circuit board (PCB) having one or more memory chips 132 and associated circuitry such as controller circuitry (not shown) resident on the PCB to provide disaggregated memory/storage for system 100. According to some second examples, system 100 may be primarily a compute system. For these second examples, card 110 may include a PCB having one or more application specific integrated chips ASICs 102 or one more programmable logic chips 132 (e.g., field programmable gate arrays (FPGAs)) resident on the PCB to provide disaggregated compute resources for system 100. According to some third examples, system 100 may be a system having a combination of memory/storage and compute resources. For these third examples, multiple cards 110 may include respective PCBs having either one or more memory chips 132 or ASICs or programmable logic chips 132 on the respective PCBs to provide disaggregated compute and memory/storage resources for system 100.

Card 110 may be in a thin and long ruler form factor. Sliding carrier 102 may house a system module PCB 104 proximate a rear portion 112 of sliding carrier 102, a midplane PCB 118 near a middle portion 122 of sliding carrier 102 and an array 108 of cards 110 disposed in a memory card zone 120 proximate a front portion 114 of sliding carrier 102. An array of fans (not shown) may be mounted to front portion 114 to draw air into sliding carrier 102 and push it between and across cards 110 included in array 108. One or more power supplies 116 may be mounted at rear portion 112 and may also have additional fans (not shown) to draw air from sliding carrier 102.

In some examples, in card zone 120, parallel cards 110 may extend from a position proximate front portion 114 toward the rear of sliding carrier 102. A switching zone 126 proximate to middle portion 106 may be connected to or coupled with cards 110 to carry a switch fabric. A rear portion 124 of sliding carrier 102 may also include interfaces 128 (e.g., network interface cards) which may interface with other types of nodes that may be located on sliding carrier 102 or on a different sliding carrier 102 (e.g., on a separate tray or sled in a computer rack).

In some examples, memory chips 132 may include nonvolatile memory and/or volatile types of memory. Nonvolatile types of memory may be a storage medium that does not require power to maintain the state of data stored by the medium. Nonlimiting examples of nonvolatile types of memory may include any or a combination of: planar or 3D NAND flash memory or NOR flash memory, 3D cross-point memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), resistive RAM, other various types of non-volatile random access memories (RAMs), and/or magnetic storage memory. Volatile types of memory may be a storage medium that requires power to maintain the state of data stored by the medium. Nonlimiting examples of volatile types of memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory included in memory chips 132 that is a volatile type of memory may comply with JEDEC standards including but not limited to Double Data Rate (DDR) standards, e.g., DDR3, 4, and 5, or Low Power DDR4 (LPDDR4) as well as emerging standards.

Figure 2:
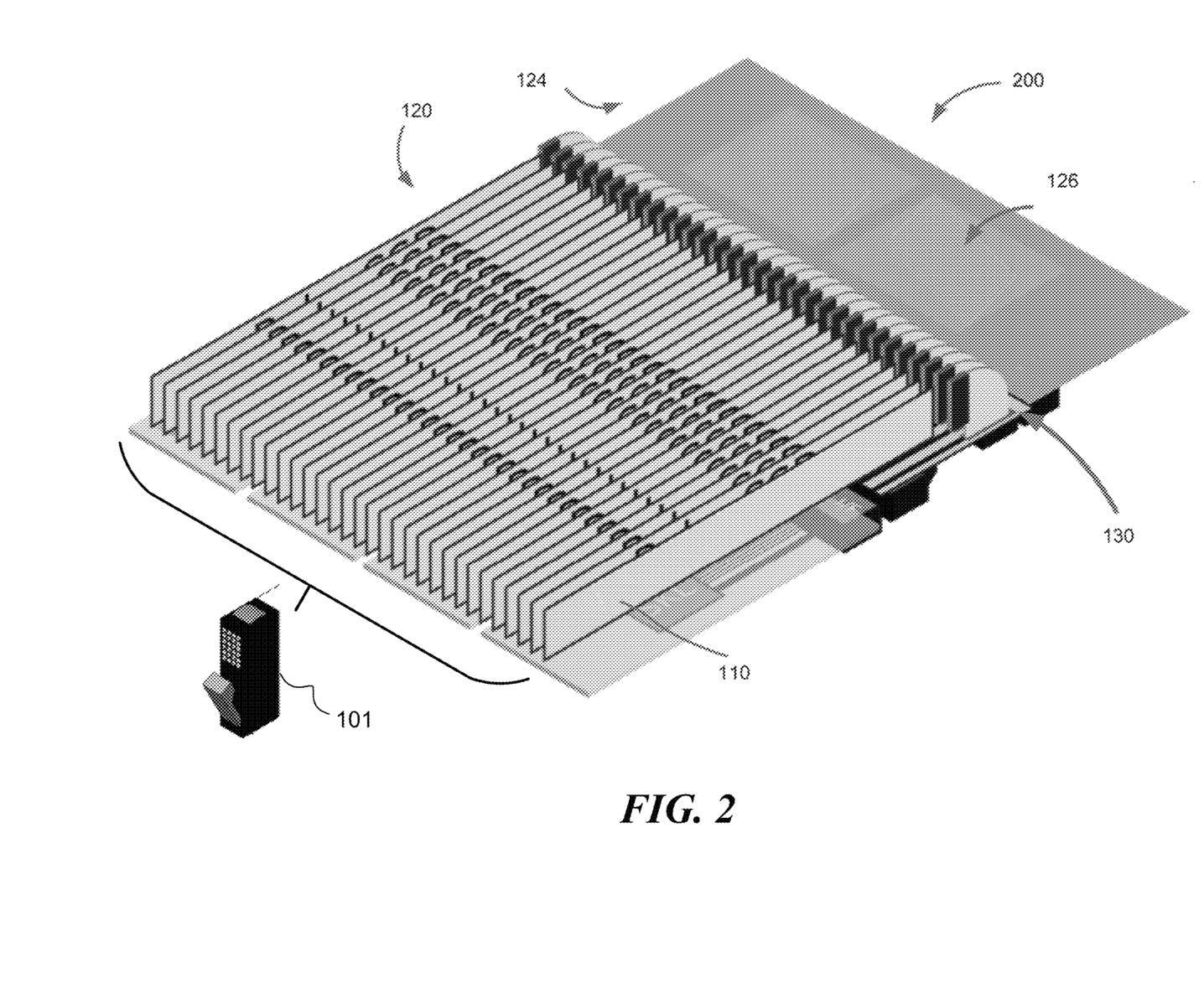
FIG. 2 illustrates an example portion of the first system.

FIG. 2 illustrates an example portion 200 of system 100. For purposes of explanation, like components of FIGS. 1 and 2 (and subsequent figures) are indicated by like numerals. In some examples, as shown in FIG. 2, portion 200 has card zone 120 with a plurality of cards 110 in a ruler form factor. For these examples, cards 110 are disposed in card zone 120 parallel and adjacent to each other. Such a disposition of cards 110 in a memory/storage system may provide for high memory/storage and/or compute node density, and a desired airflow to facilitate heat dissipation. Also, separate multipurpose latches such as a multipurpose latch 101 may be arranged to separately hold cards 110 disposed in card zone 120.

According to some examples, portion 200 may also include multiple switches 126 disposed in rear portion 124. Cards 110 may be connected or coupled with switches 126 using connectors 130 located adjacent to rear portion 124, as shown in FIG. 2.

Figure 3:
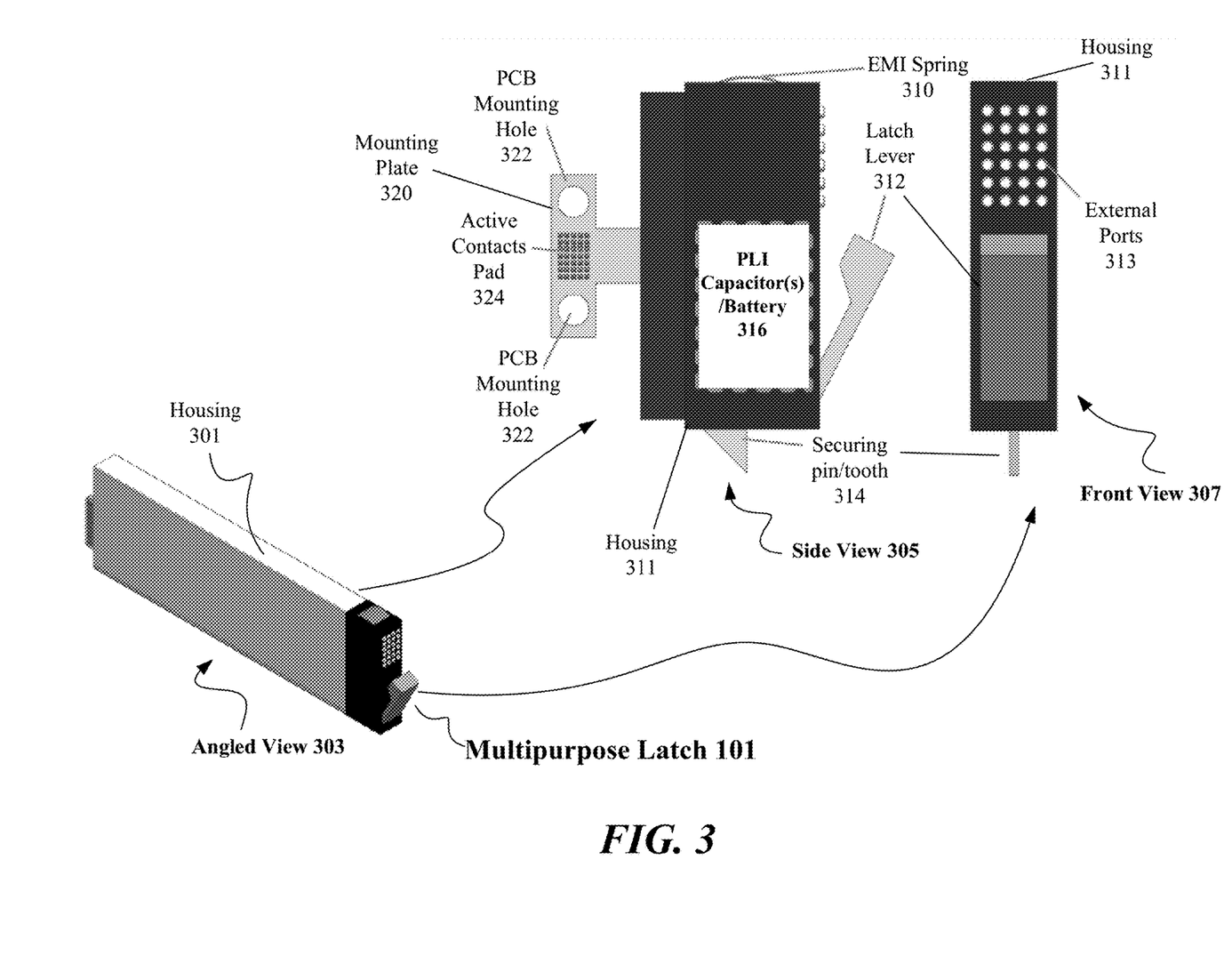
FIG. 3 illustrate an example views of a card in a ruler form factor and a multipurpose latch.

FIG. 3 illustrates example views of card 110 and multipurpose latch 101. In some examples, angled view 303 shows an angled view of a housing 301 that is attached to multipurpose latch 101. Although not shown in angled view 303, card 110 may be enclosed within housing 301. As shown in FIG. 3, side view 305 depicts a side facing view of multipurpose latch 101 and front view 307 depicts a front or forward facing view.

According to some examples, as shown in FIG. 3, side view 305 depicts an electromagnetic interference (EMI) spring 310, a housing 311, a latch lever 312, a securing pin/tooth 314, power loss imminent (PLI) capacitor(s) 316, and a mounting plate 320 that has PCB mounting holes 322 and active contacts pad 324. Also, as shown in FIG. 3, front view 307 depicts housing 311 having external ports 313 and a front facing view of latch lever 312.

In some examples, when card 110 is inserted in a host system (e.g., system 100) latch lever 312 may initially be disengaged and cause securing pin/tooth 314 to retract or move within housing 311. For these examples, latch lever 312 may be engaged and then securing pin/tooth 314 may extend from housing 311 and may move into a slot (not shown) of the host system (e.g., a slot included in front portion 114 of sliding carrier 102). Once latch lever 312 is engaged securing pin/tooth 314 may lock card 110 into position. Lever 312 may also provide an ergonomic way to handle insertion and removal of card 110 by serving as a type of handle to insert in or pull out card 110 from the host system. In some examples, latch lever 312 and securing pin/tooth 314 may also be engaged dynamically via an electromechanical control subsystem such that once card 110 is inserted into the host system and becomes operational, a technician or operator cannot physically remove card 110 from the host system. For these examples, logic and/or circuitry located at multipurpose latch 101 or on card 110 (e.g., a controller) may engage latch lever 312 and securing pin/tooth 314 to secure card 110. Once card 110 stops operating, latch lever 312 and securing pin/tooth 314 may be disengaged and card 110 may be removed responsive to a control signal either received from logic and/or circuitry located at multipurpose latch 101 or on card 110. Preventing removal of card 110 while operating may be an important function for devices such as ruler SSDs as a sudden removal of an operating ruler SSD may result in corrupted data of the host system, complete data loss or even a catastrophic shut down or hard lock of the host system.

According to some examples, front view 307 shows multiple external holes or ports 313. External ports 313, as described in more detail below, may enable external access to route control or communication links or traces through multipurpose latch 101. For example, control links or traces to manage or control card 110 while control card 110 is in an operating state and/or communication links to perform debugging or monitoring of card 110. Also, control links or traces routed through external ports 313 may route signals via these traces or links to allow latch lever 312 and securing pin/tooth 314 to be externally engaged/disengaged.

In some examples, as mentioned above, side view 305 depicts a mounting plate 320 having PCB mounting holes 322 and active contacts pad 324. For these examples, PCB mounting holes 322 may enable mounting plate 320 to be attached to a PCB included in card 110 in order to physically connect or attach multipurpose latch 101 to card 110. Active contacts pad 324 may include one or more contacts that may attach to one or more respective traces that may be routed to circuitry resident on card 110. For example, the one or more contacts on active contacts pad 324 may route traces to circuitry (e.g., controller, memory chip, FPGA or ASIC) resident on the PCB included in card 110. As described more below, these traces may couple with control or communication links routed through external ports 313 to perform debugging or monitoring of circuitry resident on the PCB included in card 110.

According to some examples, PLI capacitor(s)/battery 316 are depicted with a dashed-line box to indicate that PLI capacitor(s)/battery 316 are enclosed within housing 311. PLI capacitor(s)/battery 316 may include one or more capacitors and/or batteries to provide temporary power to circuitry resident on the PCB included in card 110 when a sudden power loss to a host system occurs. For example, provide temporary power to volatile types of memory to enable data to be stored to non-volatile types of memory following a sudden power loss or to enable compute circuitry to store state information maintained in volatile memory buffers (e.g., SRAM) to non-volatile memory following a sudden power loss. PLI capacitor(s)/battery 316 may provide all or at least a portion of the temporary power needed to eliminate or reduce data loss following a sudden power loss. Moving at least a portion of temporary power capacity off of a PCB included in card 110 may free up additional space, for example, to add more memory chips or compute circuitry to the PCB.

In some examples, EMI spring 310 may provide a basic grounding mechanism to meet electrostatic discharge (ESD)/EMI targets once card 110 is inserted in a host system. For these examples, EMI spring 310 may have sufficient spring tension to contact a ground plate of the host system to meet the ESD/EMI target yet not overly inhibit insertion or removal of card 110 to/from the host system.

Figure 4:
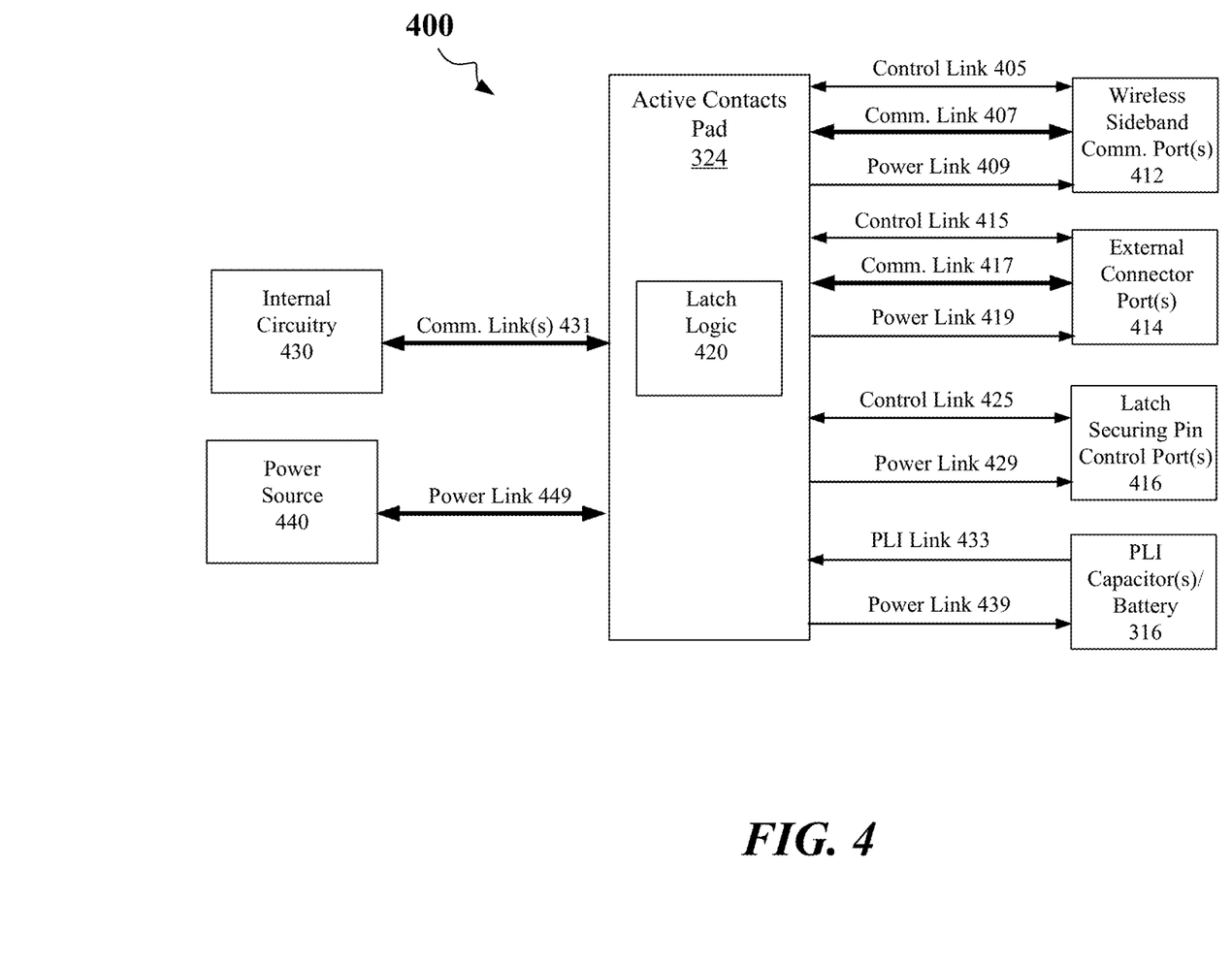
FIG. 4 illustrates an example second system.

FIG. 4 illustrates example system 400. In some examples, as shown in FIG. 4, system 400 includes active contacts pad 324 coupled with internal circuitry 430, power source 440, wireless sideband communication port(s) 412, external connector port(s) 414, latch securing pin/tooth control port(s) 416 or PLI capacitor(s)/battery 316 via various control, communication, power or PLI links. For these examples, at least some links for wireless sideband communication port(s) 412, external connector port(s) 414, latch securing pin/tooth control port(s) 416 may be routed through external ports 313 of multipurpose latch 101 shown in FIG. 3. For example, control links, 405, 415, 425 and communication links 407, 417 may be routed through external ports 313.

According to some examples, control link 405 routed from wireless sideband communication port(s) 412 or control link 415 routed from external connector port(s) 414 may be used to provide access and/or control to internal subsystems of card 110 included in circuitry 430 (e.g., memory chips, FPGAs, ASICs and/or controllers) via one or more control link(s) 431. Also control link 425 may be used to access and/or control latch lever 312 and/or securing pin/tooth 314. For example, latch logic 420 may serve as an internal control logic agent that is controlled via control link 425 to engage or disengage latch lever 312 or securing pin/tooth 314. In other examples, rather than being located at active contacts pad 324, latch logic 420 may be implemented at a controller or programmable logic included in circuitry 430 and control signals received via control link 425 to access and/or control latch lever 312 and/or securing pin/tooth 314 may be routed or forwarded via control link(s) 431 to latch logic 420. Control links 405, 415, 425 or 431 may operate according to one or more low bandwidth standard interfaces such as, but not limited to, a Joint Test Action Group (JTAG) interface or an Inter-Integrated Circuit ($I^2C$) interface. The JTAC interface may operate in compliance with Institute of Electrical and Electronics Engineers (IEEE) 1149.1-2013 Standard for Test Access Port and Boundary-Scan Architecture, published in February of 2013 ("IEEE 1149 specification"). The $I^2C$ interface may operate in compliance with the $I^2C$-bus specification, Rev. 6, published in April of 2014 ("$I^2C$ specification").

According to some examples, communication link 407 routed from wireless sideband communication port(s) 412 or communication link 417 routed from external connector port(s) 414 may be used to provide a high bandwidth (>1 gigabit per second)) serial communication path to and from the internal subsystems of card 110 included in circuitry 430 (e.g., memory chips, programmable logic chips, ASICs or controllers) via one or more communication link(s) 433. The high bandwidth serial communication path may be used to generate debug traces as well as sending real time monitoring information obtained from the internal subsystems. Communication links 407, 417 or 433 may operate according to one or more standards, for example, one or more Ethernet standards promulgated by the IEEE. One such Ethernet standard may include IEEE 802.3-2018, Carrier sense Multiple access with Collision Detection (CSMA/CD) Access Method and Physical Layer Specifications, Published in August 2018 (the "IEEE 802.3-2018 specification").

According to some examples, power links 409, 419 or 439 may route power via a direct current to interfaces associated with wireless sideband communication port(s) 412, external connector port(s) 414, latch securing pin/tooth control port(s) 416 or PLI capacitor(s)/battery 316. The direct current may be routed from a power source 440 located, for example, on a PCB included in card 110. This direct current, as shown in FIG. 4, may be routed via power link 449. Power link 439 may also route a direct current received from power source 440 while card 110 is operating in order to charge PLI capacitor(s)/battery 316. Upon a power loss to card 110, PLI link 433 may then reverse the direct current and that is why power link 449 is shown as a bi-directional link as PLI capacitor(s)/battery 316 will send that direct current to power source 440 to enable card 110 to power circuitry 430 long enough to prevent undesirable data loss.

In some examples, wireless sideband communication port(s) 412 may enable wireless communication capabilities through multipurpose latch 101 to enable no physical contact with card 110 in order to communicate with internal circuitry to control, debug or monitor internal circuitry 430. For example, access to control and communication sidebands via wireless sideband communication port(s) 412 may enable internal circuitry 430 (e.g., a controller, a programmable logic chip or an ASIC) to use those interfaces and externally communicate to other nearby board or modules of a host system. Multipurpose latch 101 may include, for example, an optical interface (not shown) capable of providing an optical near line-of-site sideband channel that is routed through wireless sideband communication port(s) 412. This optical near line-of-site sideband channel may be used to transfer data between cards or modules of the host system via a local mesh network model. This may be most beneficial in deployments where card 110 includes compute resources such as programmable logic chips and/or ASICs or is communicating with other boards having similar types of compute resources.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Figure 5:
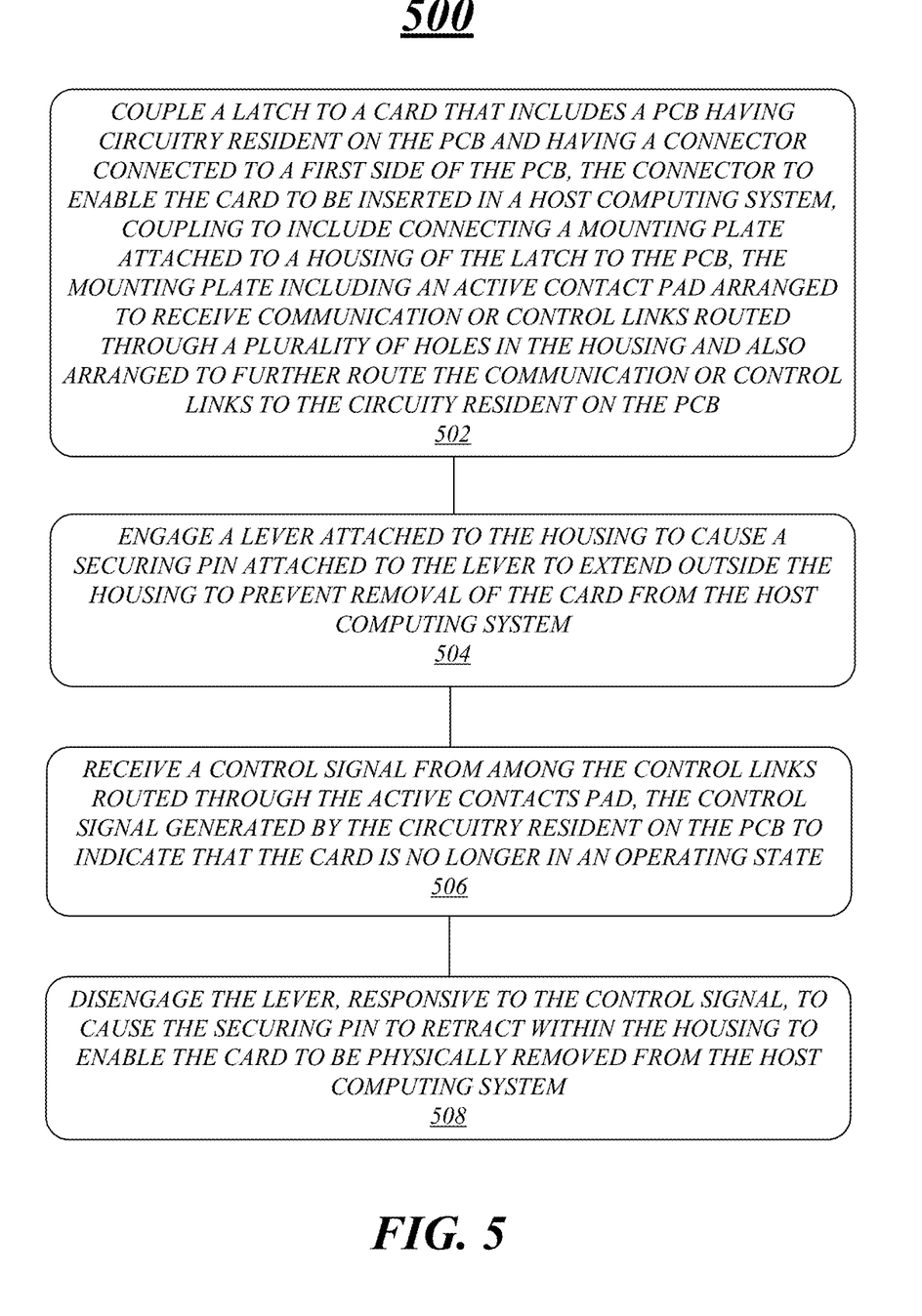
FIG. 5 illustrates an example of a logic flow.

FIG. 5 illustrates an example of a logic flow 500. Logic flow 500 may be representative of some or all of the operations executed in relation to a multipurpose latch arranged to couple with a card that may be mounted in a host computing system. For example, multipurpose latch 101 arranged to couple to card 110 that may be mounted in system 100.

According to some examples, logic flow 500 at block 502 may couple a latch to a card that includes a PCB having circuitry resident on the PCB and having a connector connected to a first side of the PCB, the connector to enable the card to be inserted in a host computing system, coupling to include connecting a mounting plate attached to a housing of the latch to the PCB, the mounting plate including an active contact pad arranged to receive communication or control links routed through a plurality of holes in the housing and also arranged to further route the communication or control links to the circuitry resident on the PCB.

In some examples, logic flow 500 at block 504 may engage a lever attached to the housing to cause a securing pin attached to the lever to extend outside the housing to prevent removal of the card from the host computing system.

According to some examples, logic flow 500 at block 506 may receive a control signal from among the control links routed through the active contacts pad, the control signal generated by the circuitry resident on the PCB to indicate that the card is no longer in an operating state.

In some examples, logic flow 500 at block 508 may disengage the lever, responsive to the control signal, to cause the securing pin to retract within the housing to enable the card to be physically removed from the host computing system.

Figure 6:
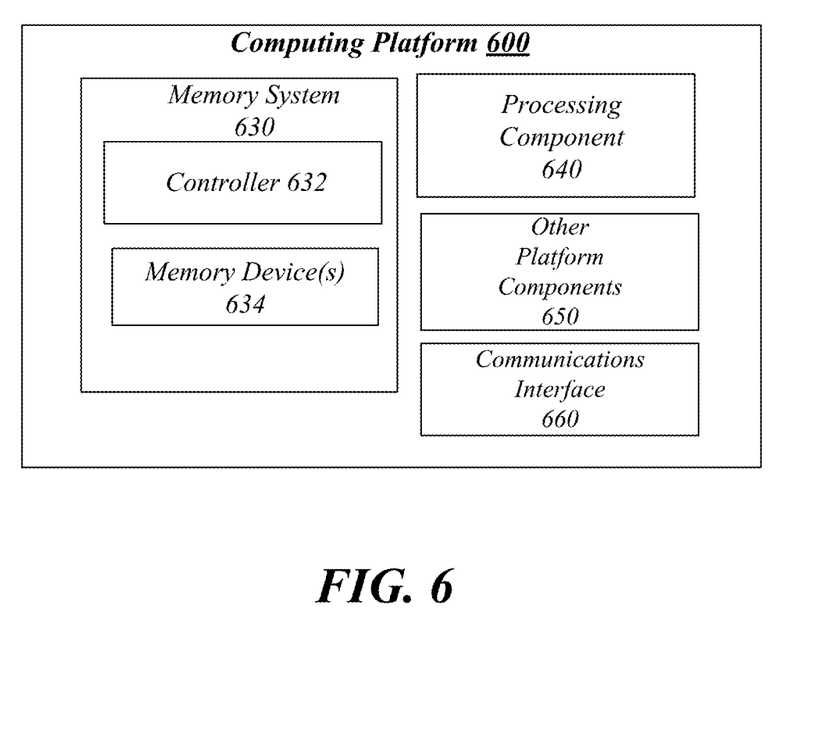
FIG. 6 illustrates an example computing platform.

FIG. 6 illustrates an example computing platform 600. In some examples, as shown in FIG. 6, computing platform 600 may include a memory system 630, a processing component 640, other platform components 650 or a communications interface 660. According to some examples, computing platform 600 may be implemented in a computing device such as a server.

According to some examples, memory system 630 may include a controller 632 and memory devices(s) 634. Memory device(s) 634 may include similar types of memory (not shown) that are described above for system 100 shown in FIGS. 1 and 2. In some examples, controller 632 may be part of a same die with memory device(s) 634. In other examples, controller 632 and memory device(s) 634 may be located on a same die and located on a same substrate or die with a processor (e.g., included in processing component 640). In yet other examples, controller 632 may be in a separate die or integrated circuit coupled with memory device(s) 634. In some examples, memory system 630 may include a plurality of cards similar to card 110 shown in FIGS. 1-3.

According to some examples, processing component 640 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 650 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 650 or memory system 630 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristors, STT-MRAM, magnetic or optical cards, and any other type of storage media suitable for storing information.

In some examples, communications interface 660 may include logic and/or features to support a communication interface. For these examples, communications interface 660 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2018.

Computing platform 600 may be part of a computing device that may be, for example, a server, a server array or server farm, a web server, a network server, an Internet server, a work station, a mini-computer, a main frame computer, a supercomputer, a network appliance, a web appliance, a distributed computing system. Accordingly, functions and/or specific configurations of computing platform 600 described herein, may be included or omitted in various embodiments of computing platform 600, as suitably desired.

The components and features of computing platform 600 may be implemented using any combination of discrete circuitry, ASICs, logic gates and/or single chip architectures. Further, the features of computing platform 600 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Although not depicted, any system can include and use a power supply such as but not limited to a battery, AC-DC converter at least to receive alternating current and supply direct current, renewable energy source (e.g., solar power or motion based power), or the like.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A latch comprising:
   a housing having a plurality of holes;
   a lever attached to the housing;
   a securing pin attached to the lever such that when the lever is engaged the securing pin extends outside of the housing;
   a mounting plate attached to the housing, the mounting plate capable of attaching to a printed circuit board (PCB) having circuitry resident on the PCB;
   an active contacts pad coupled to the mounting plate, the active contacts pad arranged to receive communication or control links routed through the plurality of holes of the housing and further route the communication or control links to the circuitry resident on the PCB;
   wherein the PCB is included in a card having a connector connected to a first side of the PCB that is opposite of a second side of the PCB that is arranged to attach to the mounting plate, the connector to enable the card to be inserted in a host computing system; and
   wherein the lever is arranged to be disengaged and cause the securing pin to retract within the housing responsive to a control signal received via a control link from among the control links routed through the active contacts pad, the control signal to indicate that the card is no longer in an operating state and can be removed from the host computing system.

2. The latch of claim 1, comprising the securing pin to keep the card inserted in the host computing system while the securing pin is extended outside of the housing and prevents removal of the card from the host computing system when the lever is engaged.

3. The latch of claim 1, further comprising:
   an electromagnetic interference (EMI) spring attached to the housing, the EMI spring to contact a ground plate of the host computing system once the card is inserted in the host computing system, contact to the ground plate to enable electrostatic discharge.

4. The latch of claim 1, the circuitry resident on the PCB comprises one or more memory chips, the card is a solid state drive (SSD) in a ruler form factor, the ruler form factor in accordance with a specification that includes SFF-TA-1006 or SFF-TA-1007.

5. The latch of claim 4, comprising the communication or control links routed through the plurality of holes of the housing are externally received in relation to the latch, the card and the host computing system, the externally received communication or control links to enable the one or more memory chips or the SSD to be debugged or monitored while the SSD is inserted in the host computing system and the SSD is in an operating state.

6. The latch of claim 1, the circuitry resident on the PCB comprises one or more programmable logic chips, the card is in a ruler form factor, the ruler form factor in accordance with a specification that includes SFF-TA-1006 or SFF-TA-1007.

7. The latch of claim 6, comprising the communication or control links routed through the plurality of holes of the housing are externally received in relation to the latch, the card and the host computing system, the externally received communication or control links to enable the one or more programmable logic chips to be debugged or monitored while the card is inserted in the host computing system and the card is in an operating state.

8. The latch of claim 1, further comprising:
   one or more capacitors or a battery to couple with a power link to a power source for the card that is powered through the host computing system, the one or more capacitors or the battery arranged to provide temporary power to provide power to the power source responsive to a power loss imminent event for the host computing system that indicates a cut to power received through the host computing system.

9. A system comprising:
   a card including a printed circuit board (PCB) that has circuitry resident on the PCB and a connector connected to a first side of the PCB, the connector to enable the card to be inserted in a host computing system, the circuitry resident on the PCB comprises one or more programmable logic chips; and
   a latch to couple to a second side of the PCB that is opposite of the first side of the PCB, the latch to include,
      a housing having a plurality of holes,
      a lever attached to the housing,
      a securing pin attached to the lever such that when the lever is engaged the securing pin extends outside of the housing prevents removal of the card from the host computing system when the lever is engaged,
      a mounting plate attached to the housing and attached to the PCB, and
      an active contacts pad coupled to the mounting plate, the active contacts pad arranged to receive communication or control links routed through the plurality of holes of the housing and further route the communication or control links to the circuitry resident on the PCB,
      wherein the communication or control links routed through the plurality of holes of the housing are externally received in relation to the latch, the card and the host computing system, the externally received communication or control links to enable the one or more programmable logic chips to be debugged or monitored while the card is inserted in the host computing system and the card is in an operating state.

10. The system of claim 9, comprising the lever arranged to be disengaged and cause the securing pin to retract within the housing responsive to a control signal received via a control link from among the control links routed through the active contacts pad, the control signal generated by the circuitry resident on the PCB to indicate that the card is no longer in an operating state and can be removed from the host computing system.

11. The system of claim 9, further comprising:
an electromagnetic interference (EMI) spring attached to the housing, the EMI spring to contact a ground plate of the host computing system once the card is inserted in the host computing system, contact to the ground plate to enable electrostatic discharge.

12. The system of claim 9, wherein the card is a solid state drive (SSD) in a ruler form factor, the ruler form factor in accordance with a specification that includes SFF-TA-1006 or SFF-TA-1007.

13. The system of claim 9, wherein the circuitry resident on the PCB comprises one or more programmable logic chips, the card is in a ruler form factor, the ruler form factor in accordance with a specification that includes SFF-TA-1006 or SFF-TA-1007.

14. The system of claim 13, wherein: the communication or control links routed through the plurality of holes of the housing are externally received in relation to the latch, the card and the host computing system, the externally received communication or control links to enable the one or more programmable logic chips to be debugged or monitored while the card is inserted in the host computing system and the card is in an operating state.

15. The system of claim 9, the latch further comprising:
one or more capacitors or a battery to couple with a power link to a power source for the card that is powered through the host computing system, the one or more capacitors or the battery arranged to provide temporary power to provide power to the power source responsive to a power loss imminent event for the host computing system that indicates a cut to power received through the host computing system.

16. A solid state drive (SSD) comprising:
a printed circuit board (PCB) that has circuitry resident on the PCB and a connector connected to a first side of the PCB, the circuitry including one or more memory chips, the connector to enable the SSD to be inserted in a host computing system; and
a latch to couple to a second side of the PCB that is opposite of the first side of the PCB, the latch:
including:
a housing having a plurality of holes,
a lever attached to the housing,
a securing pin attached to the lever such that when the lever is engaged the securing pin extends outside of the housing,
a mounting plate attached to the housing and attached to the PCB, and
an active contacts pad coupled to the mounting plate, the active contacts pad arranged to receive communication or control links routed through the plurality of holes of the housing and further route the communication or control links to the circuitry resident on the PCB;
wherein the lever is arranged to be disengaged and cause the securing pin to retract within the housing responsive to a control signal received via a control link from among the control links routed through the active contacts pad, the control signal to indicate that the SSD is no longer in an operating state and can be removed from the host computing system.

17. The solid state drive (SSD) of claim 16, wherein the communication or control links routed through the plurality of holes of the housing are externally received in relation to the latch, the SSD and the host computing system, the externally received communication or control links to enable one or more programmable logic chips to be debugged or monitored while the SSD is inserted in the host computing system and the SSD is in an operating state.

* * * * *